(12) United States Patent
Lim et al.

(10) Patent No.: US 11,048,113 B2
(45) Date of Patent: *Jun. 29, 2021

(54) DISPLAY DEVICE

(71) Applicant: SAMSUNG DISPLAY CO., LTD., Yongin-si (KR)

(72) Inventors: Sanghoon Lim, Cheonan-si (KR); Jaeyoung Yu, Asan-si (KR); Jongsung You, Suwon-si (KR); Heuiweon Yun, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 509 days.

This patent is subject to a terminal disclaimer.

(21) Appl. No.: 15/181,289

(22) Filed: Jun. 13, 2016

(65) Prior Publication Data

US 2017/0068128 A1 Mar. 9, 2017

(30) Foreign Application Priority Data

Sep. 3, 2015 (KR) .................. 10-2015-0124871

(51) Int. Cl.
*G02F 1/1335* (2006.01)
*H01L 51/52* (2006.01)
(Continued)

(52) U.S. Cl.
CPC .... *G02F 1/133512* (2013.01); *H01L 51/5284* (2013.01); *B32B 2457/20* (2013.01);
(Continued)

(58) Field of Classification Search
CPC ......... G02F 1/133512; G02F 1/133707; G02F 2001/133635; G02F 2001/133331;
(Continued)

(56) References Cited

U.S. PATENT DOCUMENTS 5,648,861 A * 7/1997 Natsuhori ............... G02F 1/135
349/110
8,906,987 B2 12/2014 Denecker
(Continued)

FOREIGN PATENT DOCUMENTS

KR 10-2010-0034075 A 4/2010
KR 10-2010-0057824 A 6/2010
(Continued)

OTHER PUBLICATIONS

Kumar, A. et al., Patterning Self-Assembled Monolayers: Applications in Materials Science, Langmuir, 1994, pp. 1498-1511, vol. 10, No. 5, American Chemical Society.
(Continued)

*Primary Examiner* — Eli D. Strah
(74) *Attorney, Agent, or Firm* — Lewis Roca Rothgerber Christie LLP

(57) ABSTRACT

A display device includes: a display panel configured to display an image; a window panel covering the display panel, and including a display area configured to transmit the image and a non-display area surrounding the display area; and an adhesive layer between the display panel and the window panel, wherein the window panel includes: a window substrate facing the display panel; a protective layer on a portion of a surface of the window substrate in the non-display area; and a light blocking layer on the protective layer, wherein the protective layer is an organic-inorganic composite layer.

17 Claims, 9 Drawing Sheets

(51) Int. Cl.
*C09J 143/04* (2006.01)
*C09J 183/06* (2006.01)
*C09J 183/14* (2006.01)
*G02F 1/1337* (2006.01)
*G02F 1/1333* (2006.01)
*G02F 1/13363* (2006.01)

(52) U.S. Cl.
CPC ... *B32B 2457/202* (2013.01); *B32B 2457/206* (2013.01); *C09J 143/04* (2013.01); *C09J 183/06* (2013.01); *C09J 183/14* (2013.01); *C09K 2323/05* (2020.08); *C09K 2323/053* (2020.08); *G02F 1/133331* (2021.01); *G02F 1/133388* (2021.01); *G02F 1/133635* (2021.01); *G02F 1/133707* (2013.01); *G02F 2201/086* (2013.01); *G02F 2201/50* (2013.01); *G02F 2202/28* (2013.01)

(58) Field of Classification Search
CPC ... G02F 2001/133388; G02F 2201/086; G02F 2201/50; G02F 2202/28; G02F 1/1333; G02F 1/133635; G02F 1/133331; G02F 1/133388; H01L 51/5284; H01L 51/5256; H01L 27/3244; C09J 183/06; C09J 183/14; C09J 143/04; B32B 2457/20; B32B 2457/202; B32B 2457/206; Y10T 428/1059; Y10T 428/1068; C09K 2323/05; C09K 2323/053
See application file for complete search history.

(56) References Cited

U.S. PATENT DOCUMENTS

| | | | | |
|---|---|---|---|---|
| 9,052,443 B2 * | 6/2015 | Park | ....................... | G02B 7/00 |
| 2009/0191484 A1 * | 7/2009 | Yang | ..................... | G03F 7/0007 |
| | | | | 430/311 |
| 2011/0009588 A1 * | 1/2011 | Hsieh | ..................... | C08C 19/02 |
| | | | | 526/279 |
| 2011/0149211 A1 * | 6/2011 | Ha | ......................... | C09J 7/0207 |
| | | | | 349/96 |
| 2011/0233533 A1 | 9/2011 | Jang et al. | | |
| 2013/0343032 A1 * | 12/2013 | Lee | ....................... | G02B 5/3083 |
| | | | | 362/19 |
| 2014/0071537 A1 * | 3/2014 | Park | ......................... | G02B 7/00 |
| | | | | 359/614 |
| 2014/0153100 A1 | 6/2014 | Yi | | |
| 2014/0377520 A1 * | 12/2014 | Chang | ..................... | B32B 27/08 |
| | | | | 428/213 |

FOREIGN PATENT DOCUMENTS

| | | |
|---|---|---|
| KR | 10-2014-0071093 A | 6/2014 |
| KR | 10-2014-0108745 A | 9/2014 |
| WO | WO-2013094476 A1 * | 6/2013 |

OTHER PUBLICATIONS

Ye, T. et al., Mechanism of UV Photoreactivity of Alkylsiloxane Self-Assembled Monolayers, Journal of Physical Chemistry B, 2005, pp. 9927-9938, vol. 109, No. 20, American Chemical Society.

Präfke, C. et al., Ultraviolet/visible and Fourier transform infrared spectroscopic investigations of organic-inorganic hybrid layers for UV protection, Thin Solid Films, 2013, pp. 113-118, vol. 532, Elsevier B.V.

Tsormpatsidis, E. et al., UV irradiance as a major influence on growth, development and secondary products of commercial importance in Lollo Rosso lettuce 'Revolution' grown under polyethylene films, Environmental and Experimental Botany, 2008, pp. 232-239, vol. 63, Elsevier B.V.

* cited by examiner

DISPLAY DEVICE

CROSS-REFERENCE TO RELATED APPLICATION

This application claims priority to and the benefit of Korean Patent Application No. 10-2015-0124871, filed on Sep. 3, 2015, the content of which is incorporated in its entirety is herein by reference.

BACKGROUND

1. Field

Aspects of example embodiments of the present invention relate to a display device.

2. Description of the Related Art

Electronic devices that provide images to users, such as smartphones, digital cameras, laptop computers, navigation units, and televisions ("TV"), include display devices for displaying images. In general, a display device includes a display panel for generating images and displaying the images, and a window panel covering the display panel to protect the display panel. In this case, the display panel and the window panel may be adhered or attached to one another by a resin material.

After the window panel and the display panel are adhered to one another by the resin, the resin may undergo photocuring by ultraviolet ("UV") light and/or the like. In this process, portions of the resin that are not sufficiently exposed to the UV light due to interference (e.g., by an apparatus and/or the like) may be insufficiently cured. Monomers in the uncured portion of the resin may permeate into a light blocking layer to thereby cause discoloration of the light blocking layer.

It is to be understood that this Background section is intended to provide useful background for understanding the technology and as such, the Background section of the present disclosure may include ideas, concepts, or recognitions that do not constitute prior art.

SUMMARY

Aspects of example embodiments of the present invention relate to a display device, and a display device which may reduce or prevent discoloration of a light blocking layer.

One or more example embodiments of the present invention include a display device including a light blocking layer in which damage by ultraviolet ("UV") light is reduced or prevented and thus discoloration thereof due to an uncured resin may be reduced or prevented.

According to an example embodiment of the present invention, a display device includes: a display panel configured to display an image; a window panel covering the display panel, and including a display area configured to transmit the image and a non-display area surrounding the display area; and an adhesive layer between the display panel and the window panel, wherein the window panel includes: a window substrate facing the display panel; a protective layer on a portion of a surface of the window substrate in the non-display area; and a light blocking layer on the protective layer, and the protective layer is an organic-inorganic composite layer.

The protective layer may include an organic material in a range of 0.1 percent by weight (wt %) to 50 wt %, and an inorganic material in a range of 50 wt % to 99.9 wt %.

The organic material may include at least one selected from the group consisting of benzotriazole, hydroxyphenyl-triazine, cyanoacrylate, benzophenone, and hindered amine light stabilizers.

The inorganic material may include at least one selected from the group consisting of silicon dioxide ($SiO_2$), titanium dioxide ($TiO_2$), aluminum oxide ($Al_2O_3$), zinc oxide (ZnO), magnesium oxide (MgO), nickel oxide (NiO), indium oxide ($In_2O_3$), tin dioxide ($SnO_2$), indium-tin oxide ("ITO"), and aluminum-zinc oxide ("AZO").

The protective layer may have a thickness in a range of 1 nanometer (nm) to 1 millimeter (mm).

The display device may further include a transparent film between the window substrate and the protective layer.

The protective layer may have a pattern.

The light blocking layer and the adhesive layer may contact one another.

The light blocking layer may include at least one ion selected from the group consisting of a gas ion or a metal ion.

The gas ion may include at least one selected from the group consisting of hydrogen (H), helium (He), carbon (C), nitrogen (N), oxygen (O), neon (Ne), xenon (Xe), and argon (Ar).

The metal ion may include at least one selected from the group consisting of lithium (Li), silicon (Si), titanium (Ti), chromium (Cr), platinum (Pt), and cobalt (Co).

A hardness of the light blocking layer may decrease from a surface thereof to an interior thereof.

The adhesive layer may include a silicon-based (Si-based) polymer represented by Chemical Formula 1:

[Chemical Formula 1]

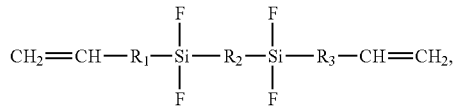

wherein F is selected from an alkoxy group including methoxy ($CH_3O$—), ethoxy ($CH_2CH_2O$—), and propoxy ($CH_3CH_2CH_2O$—), and $R_1$, $R_2$, and $R_3$ are selected from an alkane group including —$CH_2$, —$CH_2CH_2$, and —$CH_2CH_2CH_2$.

The adhesive layer may further include a UV initiator in a range of 0.01 wt % to 10 wt %.

The adhesive layer may be cured by UV light of about 10,000 millijoules per square centimeter ($mJ/cm^2$) or less.

The adhesive layer may be cured at a relative humidity in a range of 1 percent (%) to 100%.

The display panel may include: a first substrate; a second substrate on the first substrate; and a polarizer on the second substrate, the polarizer facing the window panel.

The adhesive layer may be between the polarizer and the window panel.

The display panel may be an organic light emitting diode display panel.

The display panel may be a liquid crystal display panel.

The foregoing is illustrative only and is not intended to be in any way limiting. In addition to the illustrative example embodiments, and features described above, further example embodiments, and features will become more apparent by reference to the drawings and the following detailed description.

BRIEF DESCRIPTION OF THE DRAWINGS

The above and other features and example embodiments of the invention will be more clearly understood from the following detailed description taken in conjunction with the accompanying drawings, in which.

DETAILED DESCRIPTION

Figure 1:
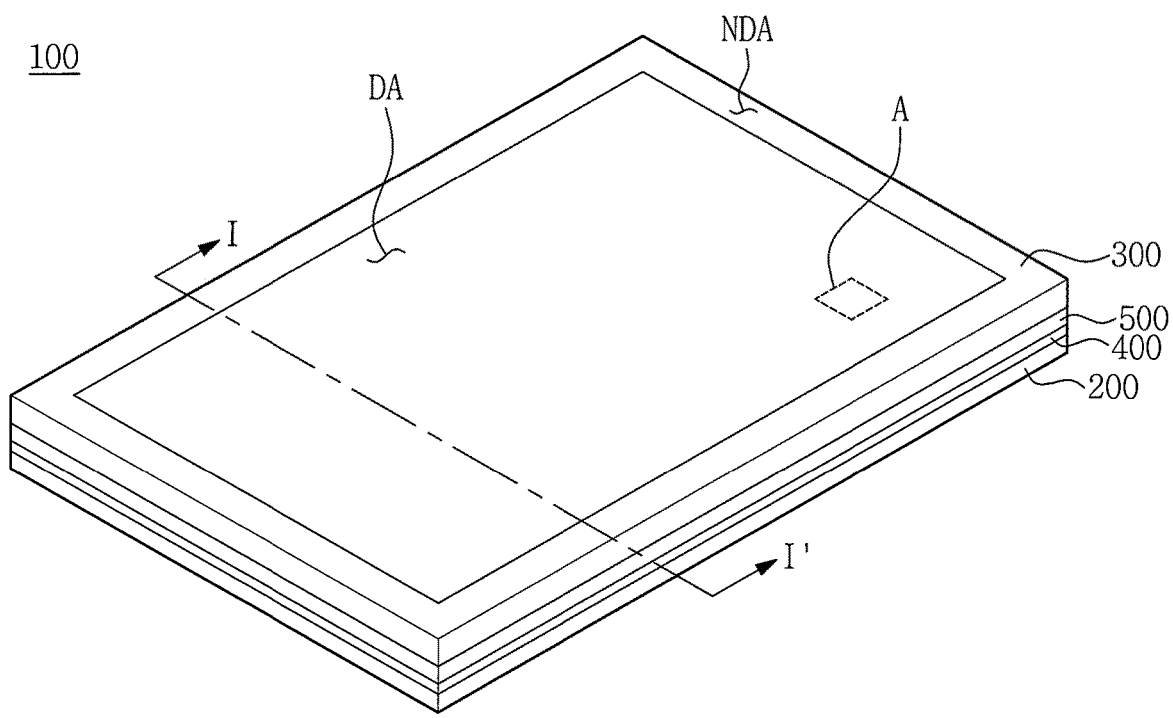
FIG. 1 is a perspective view illustrating an example embodiment of a display device.

Aspects and features of the present invention and methods for achieving them will be made more clear from example embodiments described below in detail with reference to the accompanying drawings. The invention may, however, be embodied in many different forms and should not be construed as being limited to the example embodiments set forth herein. Rather, these example embodiments are provided so that this disclosure will be more thorough and more complete, and will more fully convey the scope of the invention to those skilled in the art. The invention is merely defined by the scope of the claims, and their equivalents. Therefore, well-known constituent elements, operations and techniques may not be described in detail in the example embodiments in order to prevent the invention from being obscurely interpreted. Like reference numerals refer to like elements throughout the specification.

The terminology used herein is for the purpose of describing particular embodiments only and is not intended to be limiting. Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, one or more example embodiments of a display device according to the invention are explained with respect to an organic light emitting diode ("OLED") display device including an organic light emitting layer. However, the display device is not limited thereto, and features of the invention may be applied to a liquid crystal display ("LCD") device, a plasma display panel ("PDP") display device, a field emission display ("FED") device, and/or the like.

In addition, in the accompanying drawings, the display device according to the one or more example embodiments is illustrated as an active matrix organic light emitting diode ("AMOLED") display device having a 2 transistor-1 capacitor (2Tr-1Cap) structure in which a single pixel includes two thin film transistors ("TFT") and a single capacitor. However, the example embodiments are not limited thereto. Thus, in the OLED display device according to the example embodiments, the number of TFTs, the number of capacitors, and the number of wirings are not limited. As used herein, the term "pixel" refers to a minimum unit for displaying an image, and the OLED display device displays an image through a plurality of pixels.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined herein.

Hereinafter, an example embodiment of the display device will be described with reference to the figures.

FIG. 1 is a perspective view illustrating an example embodiment of a display device 100.

Referring to FIG. 1, an upper planar surface of the display device 100 includes a display area DA and a non-display area NDA surrounding the display area DA (e.g., outside a periphery of the display area DA). As referred to herein, the display area DA may be an area at which an image is displayed to be viewed by a user. The non-display area NDA may be an area at which an image is not displayed, or outside the display area DA. The non-display area NDA may be printed in black. However, the color of the non-display area NDA is not limited thereto, and the non-display area NDA may be printed in various suitable colors other than black. For example, the non-display area NDA may be printed in white.

The upper planar surface of the display device 100 of FIG. 1 corresponds or substantially corresponds to an upper planar surface of a window panel 300, and additional description pertaining thereto will be provided below with reference to FIG. 2.

Figure 2:
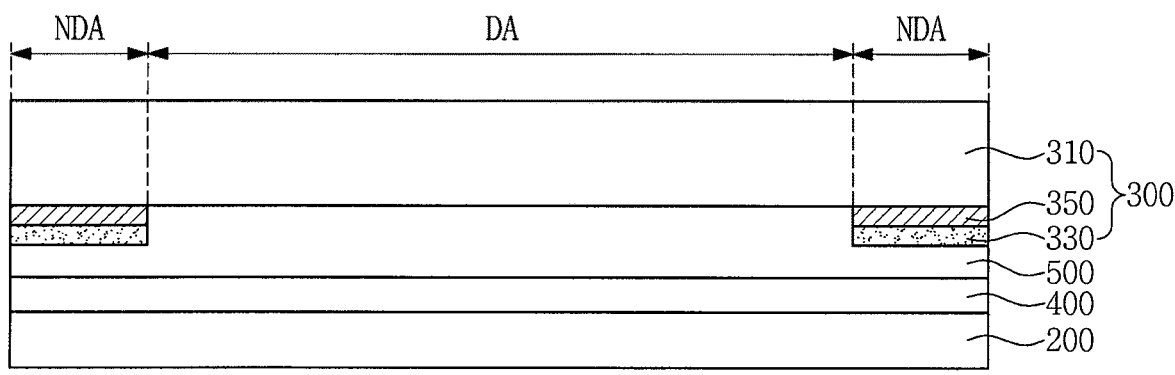
FIG. 2 is a cross-sectional view taken along the line I-I' of FIG. 1.

FIG. 2 is a cross-sectional view taken along the line I-I' of FIG. 1. Referring to FIG. 2, the display device 100 includes a display panel 200, the window panel 300 on the top of (e.g., above or covering) the display panel 200, and an adhesive layer 500 interposed between the display panel 200 and the window panel 300.

The display panel 200 is configured to generate an image. The image generated on the display panel 200 is transmitted through the window panel 300 to be viewed by a user.

The display panel 200 may include a self-emission display panel, such as an OLED display panel, or a non-self emission display panel, such as an LCD panel or an electrophoretic display ("EPD") panel. A more detailed description on the display panel 200 will be provided later with reference to FIG. 7.

The window panel 300 is arranged on the top of (e.g., above or covering) the display panel 200 to protect the display panel 200 from external objects that may damage or scratch the display panel 200.

The window panel 300 includes a window substrate 310, a protective layer 350 arranged on one surface of the window substrate 310, and a light blocking layer 330 arranged on the protective layer 350.

Similar to the upper planar surface of the window panel 300, an upper planar surface of the window substrate 310 includes a display area DA and a non-display area NDA surrounding the display area DA. The window substrate 310 faces the display panel 200.

The window substrate 310 may have a quadrangular shape having the same or substantially the same planar area as that of the display panel 200. However, the shape of the window substrate 310 is not limited thereto. In some example embodiments, the window substrate 310 may have one or more suitable shapes, such as a circular shape including rounded and/or curved corners or edges.

The window substrate 310 may include a light-transmissive transparent film. Accordingly, the image generated on the display panel 200 may be transmitted through the display area DA of the window substrate 310 to be viewed by a user.

The protective layer 350 and the light blocking layer 330 are arranged (e.g., stacked) on a portion of one surface of the window substrate 310 facing the display panel 200 that corresponds to the non-display area NDA.

The protective layer 350 is arranged between the window substrate 310 and the light blocking layer 330 in the non-display area NDA. The protective layer 350 may block ultraviolet ("UV") light to reduce or effectively prevent damage to the light blocking layer 330, thereby reducing or effectively preventing discoloration of the light blocking layer 330 that may be caused by an uncured resin of the adhesive layer 500 permeating into the light blocking layer 330. A description on discoloration prevention effects attributed to the arrangement of the protective layer 350 will be provided later with reference to FIGS. 5A and 5B.

In an example embodiment, the protective layer 350 may be an organic-inorganic composite layer. In such an example embodiment, the protective layer 350 may include an organic material in an amount ranging from 0.1 percent by weight (wt %) (or about 0.1 wt %) to 50 wt % (or about 50 wt %), and an inorganic material in an amount ranging from 50 wt % (or about 50 wt %) to 99.9 wt % (or about 99.9 wt %).

Non-limiting examples of the organic material may include at least one selected from the group consisting of benzotriazole, hydroxyphenyltriazine, cyanoacrylate, benzophenone, and hindered amine light stabilizers ("HALS"). Commercially available examples of HALS may include at least one selected from the group consisting of Ciba™ TINUVIN® 292, Ciba™ TINUVIN®328, Ciba™ TINUVIN® 384, and Ciba™ TINUVIN® 1130.

Non-limiting examples of the inorganic material may include at least one selected from the group consisting of silicon dioxide ($SiO_2$), titanium dioxide ($TiO_2$), aluminum oxide ($Al_2O_3$), zinc oxide (ZnO), magnesium oxide (MgO), nickel oxide (NiO), indium oxide ($In_2O_3$), tin dioxide ($SnO_2$), indium-tin oxide ("ITO"), and aluminum-zinc oxide ("AZO").

The protective layer 350 may be provided by co-depositing the organic material and the inorganic material directly on the window substrate 310. However, the manner of forming or arranging the protective layer 350 on one surface of the window substrate 310 is not limited thereto, and the protective layer 350 may be formed or arranged in any suitable manner.

The protective layer 350 may have a thickness that is not particularly limited as long as the protective layer 350 is capable of blocking UV light. For example, however, the protective layer 350 may have a thickness in a range of 1 nanometer (nm) (or about 1 nm) to 1 millimeter (mm) (or about 1 mm).

Figure 3:
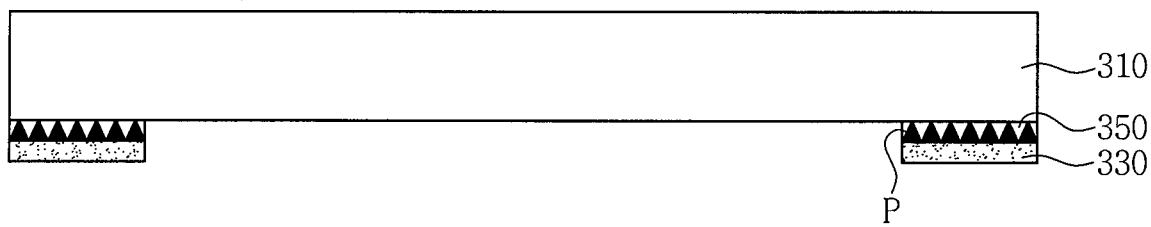
FIGS. 3 and 4 are cross-sectional views illustrating other example embodiments of window panels.

In addition, as illustrated in FIG. 3, the protective layer 350 may have a pattern P. The pattern P may have any suitable shape, for example, a three-dimensional ("3D") pattern or a lattice pattern. Accordingly, the protective layer 350 may provide visual effects to a user, in addition to the aforementioned UV blocking effects. However, the shape of the pattern P that provides 3D effects and the manner of providing thereof are not particularly limited, and any suitable known manner of providing a pattern may be utilized.

The light blocking layer 330 is arranged on the protective layer 350.

The light blocking layer 330 may include an organic material having a color (e.g., a predetermined color). Accordingly, the color of the light blocking layer 330 in the non-display area NDA of the window substrate 310 may be viewed to a user. The light blocking layer 330 may additionally prevent certain components utilized in conjunction with the display panel 200, such as a driver unit for driving the display panel 200 and an accommodation unit in which the display panel 200 is accommodated, from being visible to a user.

The light blocking layer 330 may have various colors including, for example, black or white. In the case that the light blocking layer 330 is black, the light blocking layer 330 may include a black matrix. In the case that the light blocking layer 330 is white, the light blocking layer 330 may include an organic insulating material such as a white resin. In an alternative example embodiment, the light blocking layer 330 may include an opaque inorganic insulating material such as CrOx and/or MoOx, and/or an opaque organic insulating material such as a black resin. Accordingly, the light blocking layer 330 may block light from and/or to the display panel 200 or may prevent or reduce the visibility of an internal structure of the display panel 200, and may determine the color of the window panel 300.

In an example embodiment, the light blocking layer 330 may have a monolayer structure. However, the structure of the light blocking layer 330 is not limited thereto. In an alternative example embodiment, the light blocking layer 330 may have a multilayer structure including a plurality of layers having substantially the same thickness or different thicknesses.

In an example embodiment, the light blocking layer 330 may be provided by printing a composition directly on the window substrate 310. In an alternative example embodiment, the light blocking layer 330 may be provided by any suitable manner available in the pertinent art.

Figure 4:
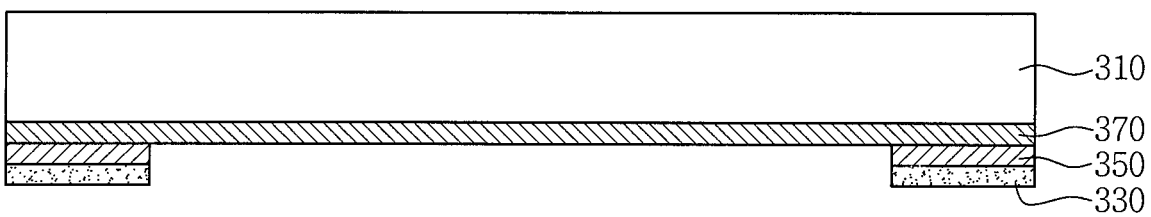

For example, as illustrated in FIG. 4, the protective layer 350 and the light blocking layer 330 may be arranged (e.g., stacked) on the window substrate 310 by depositing an organic material and an inorganic material to form the protective layer 350, printing a composition on the protective layer 350 to form the light blocking layer 330, arranging (e.g., stacking) the protective layer 350 and the light blocking layer 330 on a transparent film 370, such as a polyethylene terephthalate ("PET") film, and bonding the transparent film 370 to the window substrate 310. However, the manner of arranging or forming the protective layer 350 and the light blocking layer 330 on one surface of the window substrate 310 is not limited thereto, and may include any suitable manner available in the pertinent art.

The light blocking layer 330 contacts the adhesive layer 500 interposed between the display panel 200 and the window panel 300.

The adhesive layer 500 may be a resin, for example, a photo-curable resin. When a photopolymerization initiator included in the resin in a relatively small amount receives light, for example, UV light, a photopolymerization reaction is initiated such that a monomer and an oligomer, which are major components of the resin, momentarily form a polymer to be cured.

A polarizer 400 is arranged or formed on the display panel 200, for example, between the display panel 200 and the adhesive layer 500. The polarizer 400 may convert an optical axis of light irradiated from the display panel 200.

The polarizer 400 may have substantially the same size as that of the display panel 200 so as to cover the display panel 200. The polarizer 400 may have a monolayer structure or may have a multilayer structure including a polarizing film and a phase difference film.

Hereinafter, the discoloration prevention effects will be described in greater detail with reference to FIGS. 5A and 5B.

Figure 5A:
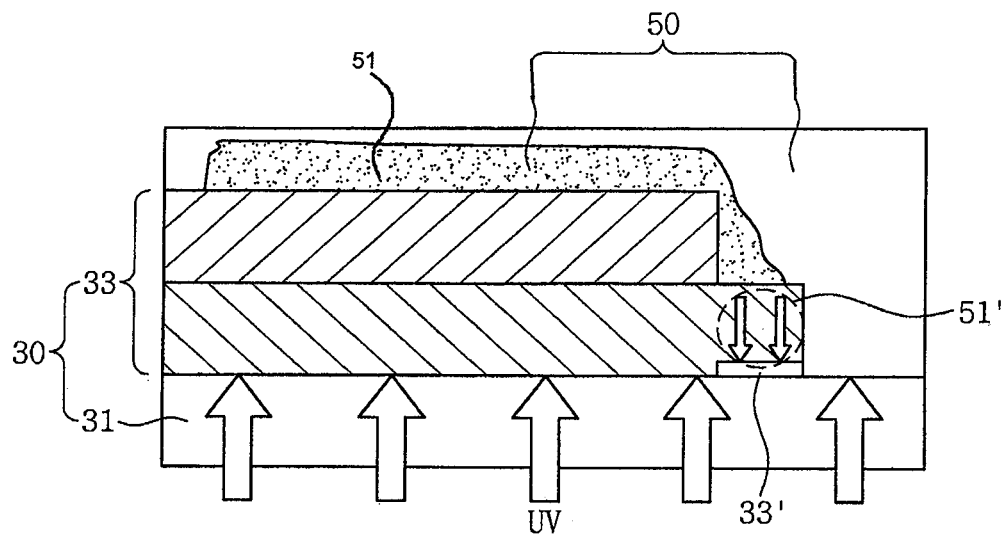
FIGS. 5A and 5B are cross-sectional views illustrating a related art window panel and a window panel of FIG. 1 for comparison.
Figure 5B:
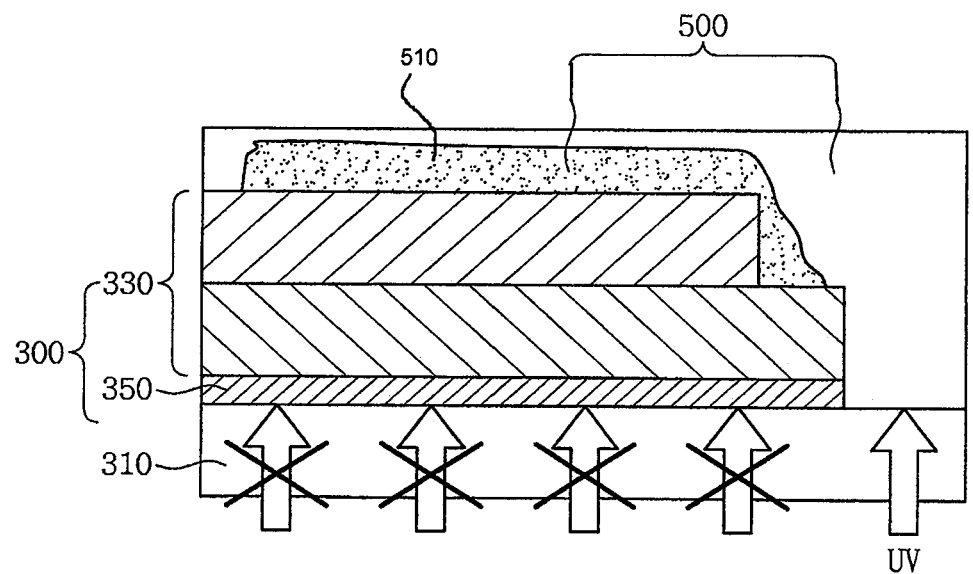

FIGS. 5A and 5B are cross-sectional views illustrating a conventional window panel 30 and the window panel 300 of FIG. 1 for comparison.

Referring to FIGS. 5A and 5B, the conventional window panel 30 is illustrated in FIG. 5A, and the window panel 300 according to an example embodiment according to FIG. 5B.

FIGS. 5A and 5B respectively illustrate a light blocking layer 33 and the light blocking layer 330, each of which includes two layers having substantially the same thickness. However, the structure of the light blocking layers 33 and 330 is not limited thereto, and may include a monolayer structure or may include a multilayer structure including a plurality of layers having different thicknesses from one another.

The conventional window panel 30 includes a window substrate 31, and the light blocking layer 33 in a non-display area of the window substrate 31. In the conventional structure, UV light irradiated for the photo-curing of an adhesive layer 50 damages the light blocking layer 33. In addition, monomers 51' of a portion of a resin 51 that is uncured for not being sufficiently exposed to the UV light due to interference by an apparatus, and the like, permeate into the damaged light blocking layer 33 to thereby cause a discoloration 33' of the light blocking layer 33. Accordingly, discoloration of the window substrate 31 of the conventional window panel 30 may occur.

The window panel 300 according to an example embodiment includes the window substrate 310, the protective layer 350 in the non-display area of the window substrate 310, and the light blocking layer 330 on the protective layer 350. In the window panel 300 according to an example embodiment, the protective layer 350 is arranged between the window substrate 310 and the light blocking layer 330 so reduce or effectively prevent UV light from reaching the light blocking layer 330. As such, because the protective layer 350 reduces or effectively prevents damage that may be caused to the light blocking layer 330 due to being exposed to UV light, monomers of an uncured portion of a resin 510 may not permeate into the light blocking layer 330 such that discoloration of the light blocking layer 330 may not occur. Accordingly, the light blocking layer 330 may serve a light blocking function without discoloration occurring therein, and thus, may reduce or effectively prevent discoloration of the window substrate 310.

Hereinafter, a pixel of a display panel will be described with reference to FIGS. 6 and 7.

Figure 6:
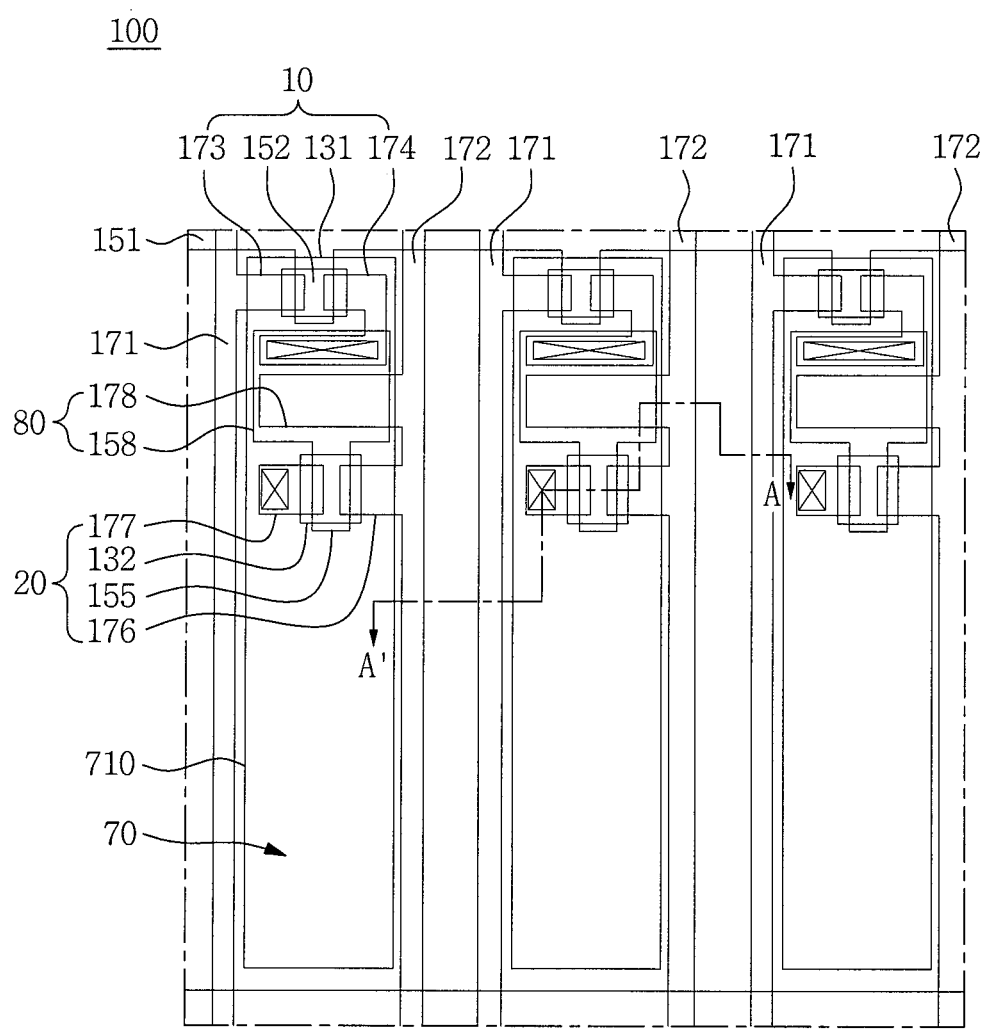
FIG. 6 is a plan view illustrating a pixel of a display panel in area "A" of FIG. 1.

FIG. 6 is a schematic plan view illustrating a pixel of the display panel 200 in area "A" of FIG. 1. FIG. 7 is a cross-sectional view taken along the line A-A' of FIG. 6.

Figure 7:
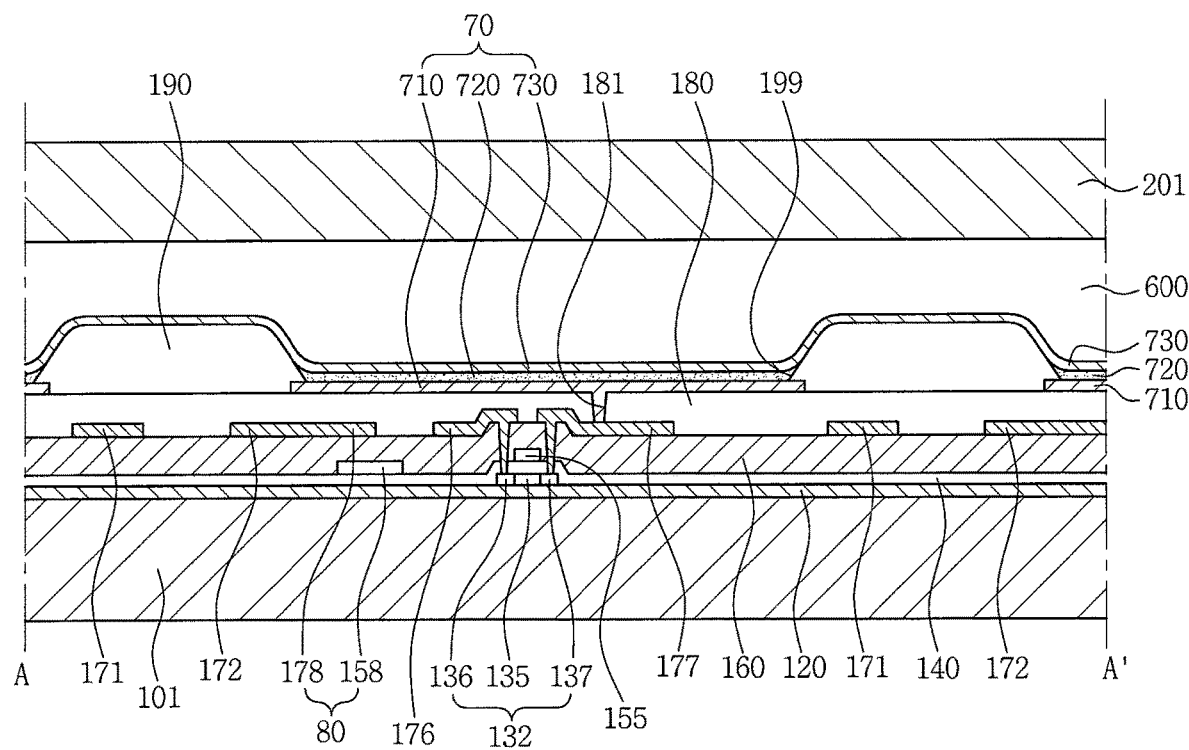
FIG. 7 is a cross-sectional view taken along the line A-A' of FIG. 6.

Referring to FIGS. 6 and 7, the display device 100 is illustrated as an active matrix organic light emitting diode ("AMOLED") display device having a 2 transistor-1 capacitor (2Tr-1Cap) structure in which each pixel includes two thin film transistors ("TFT"), for example, a switching TFT 10 and a driving TFT 20, and a capacitor, for example, a capacitor 80. However, example embodiments are not limited thereto.

Accordingly, the OLED display device 100 may have any suitable structure, for example, a structure in which three or more TFTs and two or more capacitors are included in a pixel and additional wirings may be further included. As used herein, the term "pixel" refers to a minimum unit for displaying an image, and an image may be displayed in the display area through a plurality of pixels.

In an example embodiment, the OLED display device 100 includes a first substrate 101. The switching TFT 10, the driving TFT 20, the capacitor 80, and an OLED 70 are arranged in each of the plurality of pixels defined in the first substrate 101. A gate line 151 extending in one direction, and a data line 171 and a common power line 172 intersecting (e.g., crossing) and insulated from the gate line 151 are further arranged on the first substrate 101.

In such an example embodiment, the plurality of pixels may be located at intersecting areas of the gate lines 151, the data lines 171, and the common power lines 172. However, the location of the pixels is not limited thereto.

The OLED 70 may include a first electrode 710, an organic light emitting layer 720 on the first electrode 710, and a second electrode 730 on the organic light emitting layer 720. Each pixel may include one or more first electrodes 710, and accordingly, the first substrate 101 may include the plurality of first electrodes 710 spaced apart from one another.

In such an example embodiment, the first electrode 710 may be a positive electrode (e.g., an anode electrode), for example, a hole injection electrode. The second electrode 730 may be a negative electrode (e.g., a cathode electrode), for example, an electron injection electrode. However, the types or kinds of the first and second electrodes 710 and 730 are not limited thereto, and the first electrode 710 may be a cathode electrode and the second electrode 730 may be an anode electrode based on the driving scheme of the OLED display device 100. In such an exemplary embodiment, the first electrode 710 is a pixel electrode, and the second electrode 730 is a common electrode.

A hole and an electron injected into the organic light emitting layer 720 may combine with one another to form an exciton. The OLED 70 emits light by energy generated when the exciton falls from an excited state to a ground state.

The capacitor 80 includes a pair of storage electrodes, for example, first and second storage electrodes 158 and 178 that are arranged to have an insulating layer 160 therebetween. In such an example embodiment, the insulating layer 160 may be a dielectric material. The capacitance of the capacitor 80 may be determined by an amount of electric charge stored in the capacitor 80 and the level of a voltage across the first and second storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may be used as a switching element for selecting a pixel to emit light. The switching gate electrode 152 is connected to the gate line 151. The switching source electrode 173 is connected to the data line 171. The switching drain electrode 174 is spaced apart from the switching source electrode 173 and is connected to the first storage electrode 158.

The driving TFT 20 applies, to the first electrode 710, a driving power for emitting light from the organic light emitting layer 720 of the OLED 70 for the corresponding pixel selected by the switching TFT 10. The driving gate electrode 155 is connected to the first storage electrode 158 which is connected to the switching drain electrode 174. The driving source electrode 176 and the second storage electrode 178 are connected to the common power line 172.

The driving drain electrode 177 is connected to the first electrode 710 of the OLED 70 through a drain contact hole 181.

With the configuration of the switching TFT 10 and the driving TFT 20 as described hereinabove, the switching TFT 10 is operated by a gate voltage applied to the gate line 151 to transmit a data voltage applied to the data line 171 to the driving TFT 20.

A voltage having a level substantially equal to a difference between a level of a common voltage applied from the common power line 172 to the driving TFT 20 and a level of the data voltage transmitted from the switching TFT 10 is stored in the capacitor 80. A current having a level corresponding to the level of the voltage stored in the capacitor 80 flows to the OLED 70 through the driving TFT 20 to enable the OLED 70 to emit light.

Hereinafter, the configuration of the OLED display device 100 will be described in greater detail with reference to FIGS. 6 and 7.

The components illustrated in FIG. 7 including the OLED 70, the driving TFT 20, the capacitor 80, the data line 171, and the common power line 172 will be described hereinbelow. The stacked structure of the switching TFT 10 which includes the switching semiconductor layer 131, the switching gate electrode 152, the switching source electrode 173, and the switching drain electrode 174 is the same as the stacked structure of the driving TFT 20 which includes the driving semiconductor layer 132, the driving gate electrode 155, the driving source electrode 176, and the driving drain electrode 177. Thus, the repetitive description thereof will be omitted herein for conciseness.

In an example embodiment, the first substrate 101 may be an insulating substrate including glass, quartz, ceramic, plastic, or the like. However, the material included in the first substrate 101 is not limited thereto, and the first substrate 101 may be a metallic substrate including stainless steel, or the like.

A buffer layer 120 is arranged or formed on the first substrate 101. The buffer layer 120 may reduce or effectively prevent the infiltration of impurities into the first substrate 101, and may planarize a surface of the first substrate 101.

The buffer layer 120 may include at least one selected from silicon nitride ($SiN_x$), silicon oxide ($SiO_2$), and silicon oxynitride (SiOxNy). However, the buffer layer 120 is not invariably required, and thus, may be omitted based on the type or kind of the first substrate 101, process conditions, and the like.

The driving semiconductor layer 132 is arranged or formed on the buffer layer 120. The driving semiconductor layer 132 may include a semiconductor material including at least one selected from polycrystalline silicon, amorphous silicon, and an oxide semiconductor. In an example embodiment, the driving semiconductor layer 132 may include a channel region 135 not doped with impurities, and a source region 136 and a drain region 137 provided respectively on both sides of the channel region 135 and doped with p-type impurities. In such an exemplary embodiment, ions used for doping may be p-type impurities such as boron (B), for example, diborane ($B_2H_6$). The type or kind of dopant impurities may vary based on the type or kind of the TFT.

A gate insulating layer 140 is arranged on the driving semiconductor layer 132. The gate insulating layer 140 may include at least one selected from tetraethyl orthosilicate ("TEOS"), $SiN_x$, and $SiO_2$. In an example embodiment, the gate insulating layer 140 may have a double-layer structure in which a $SiN_x$ layer having a thickness of about 40 nm and a TEOS layer having a thickness of about 80 nm are sequentially stacked. However, the structure of the gate insulating layer 140 is not limited thereto, and the gate insulating layer 140 may have any suitable structure.

The driving gate electrode 155, the gate line 151 (refer to FIG. 6), and the first storage electrode 158 are arranged on the gate insulating layer 140. In such an example embodiment, the driving gate electrode 155 overlaps at least a portion of the driving semiconductor layer 132, for example, the channel region 135. The driving gate electrode 155 may reduce or effectively prevent or reduce instances of impurities being doped in the channel region 135 when the impurities are doped in the source region 136 and the drain region 137 of the driving semiconductor layer 132 during the formation of the driving semiconductor layer 132.

The driving gate electrode 155 and the first storage electrode 158 are disposed on substantially the same layer and may include substantially the same metal. The driving gate electrode 155 and the first storage electrode 158 may include at least one selected from molybdenum (Mo), chromium (Cr), and tungsten (W). In an exemplary embodiment, the driving gate electrode 155 and the first storage electrode 158 may include an alloy including Mo or a Mo alloy.

The insulating layer 160 is arranged on the gate insulating layer 140 to cover the driving gate electrode 155. The insulating layer 160 may include an insulating interlayer. The insulating layer 160 may include $SiN_X$ and/or $SiO_2$, similarly to the gate insulating layer 140. Contact holes are defined in the gate insulating layer 140 and the insulating layer 160 to expose the source region 136 and the drain region 137 of the driving semiconductor layer 132 therethrough, respectively.

The driving source electrode 176, the driving drain electrode 177, the data line 171, the common power line 172, and the second storage electrode 178 are disposed on the insulating layer 160 in the display area DA. The driving source electrode 176 and the driving drain electrode 177 are connected to the source region 136 and the drain region 137 of the driving semiconductor layer 132 through the contact holes, respectively.

Accordingly, the driving TFT 20 which includes the driving semiconductor layer 132, the driving gate electrode 155, the driving source electrode 176, and the driving drain electrode 177 is provided. However, the configuration of the driving TFT 20 is not limited thereto, and may be modified to have any suitable structure.

A passivation layer 180 is arranged on the insulating layer 160 to cover the driving source electrode 176, the driving drain electrode 177, and the like. The passivation layer 180 may include an organic material such as polyacrylate, polyimide, or the like. The passivation layer 180 may be a planarization layer.

The passivation layer 180 may include at least one selected from a polyacrylate resin, an epoxy resin, a phenolic resin, a polyamide resin, a polyimide resin, an unsaturated polyester resin, a poly(phenyleneether) resin, a poly(phenylenesulfide) resin, and benzocyclobutene ("BCB").

The drain contact hole 181 is defined in the passivation layer 180, and the driving drain electrode 177 is exposed through the drain contact hole 181.

The first electrode 710 is arranged on the passivation layer 180, and is connected to the driving drain electrode 177 through the drain contact hole 181 of the passivation layer 180.

A pixel defining layer 190 is arranged on the passivation layer 180 to cover a portion of the first electrode 710. An aperture 199 is defined in the pixel defining layer 190, and the first electrode 710 is exposed through the aperture 199.

In such an example embodiment, the first electrode 710 is arranged to correspond to the aperture 199 of the pixel defining layer 190. The pixel defining layer 190 may include a resin such as a polyacrylate resin or a polyimide resin.

The organic light emitting layer 720 is arranged on the first electrode 710 within the aperture 199 of the pixel defining layer 190, and the second electrode 730 is arranged on the pixel defining layer 190 and the organic light emitting layer 720.

As such, the OLED 70 includes the first electrode 710, the organic light emitting layer 720, and the second electrode 730.

One of the first electrode 710 and the second electrode 730 may include a transparent conductive material, and the other thereof may include a transflective conductive material or a reflective conductive material. The OLED display device 100 may be determined to be one of a top-emission-type display device, a bottom-emission-type display device, and a both-side (e.g., dual) emission-type display device based on the type or kind of materials included in the first and second electrodes 710 and 730.

In an example embodiment, for example, in a case in which the OLED display device 100 is a top-emission-type display device, the first electrode 710 may include a transflective or reflective conductive material, and the second electrode 730 may include a transparent conductive material.

The transparent conductive material may include at least one selected from indium-tin oxide ("ITO"), indium-zinc oxide ("IZO"), zinc oxide (ZnO), and indium oxide ($In_2O_3$). The reflective material may include at least one selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

The organic light emitting layer 720 may include a low molecular weight organic material or a high molecular weight organic material. The organic light emitting layer 720 may have a multilayer structure including at least one of a light emitting layer, a hole injection layer ("HIL"), a hole transporting layer ("HTL"), an electron transporting layer ("ETL") and an electron injection layer ("EIL"). In an exemplary embodiment, the HIL may be arranged on the first electrode 710, which is an anode electrode, and the HTL, the light emitting layer, the ETL, and the EIL may be sequentially stacked thereon.

Although not illustrated, a capping layer may further be arranged on the second electrode 730. The capping layer may protect the OLED 70 and may help the light generated from the organic light emitting layer 720 to be efficiently emitted externally.

A second substrate 201 may be sealed and/or bonded to the first substrate 101 with the OLED 70 therebetween. The second substrate 201 sealingly encapsulates the switching TFT 10, the driving TFT 20, the OLED 70, and the like, which are arranged on the first substrate 101, to protect the encapsulated components from external influences. The second substrate 201 may generally use an insulating substrate including glass, plastic, or the like. In the case of a top-emission-type display device in which an image is displayed toward the second substrate 201, the second substrate 201 may include a light-transmissive material.

A buffer material 600 is arranged between the first substrate 101 and the second substrate 201. The buffer material 600 may protect internal components of the OLED display device 100, such as the OLED 70, against external impacts that may be applied to the OLED display device 100. Further, the buffer material 600 may enhance the mechanical reliability of the OLED display device 100. The buffer material 600 may include at least one of an organic sealant such as a urethane resin, an epoxy resin, and/or an acrylic resin, and an inorganic sealant such as silicone.

Hereinafter, an example embodiment of manufacturing processes of the display device will be described with reference to FIGS. 8A, 8B, 8C, 8D, and 8E.

FIGS. 8A, 8B, 8C, 8D, and 8E are cross-sectional views illustrating an example embodiment of the manufacturing processes of the display device.

Figure 8A:
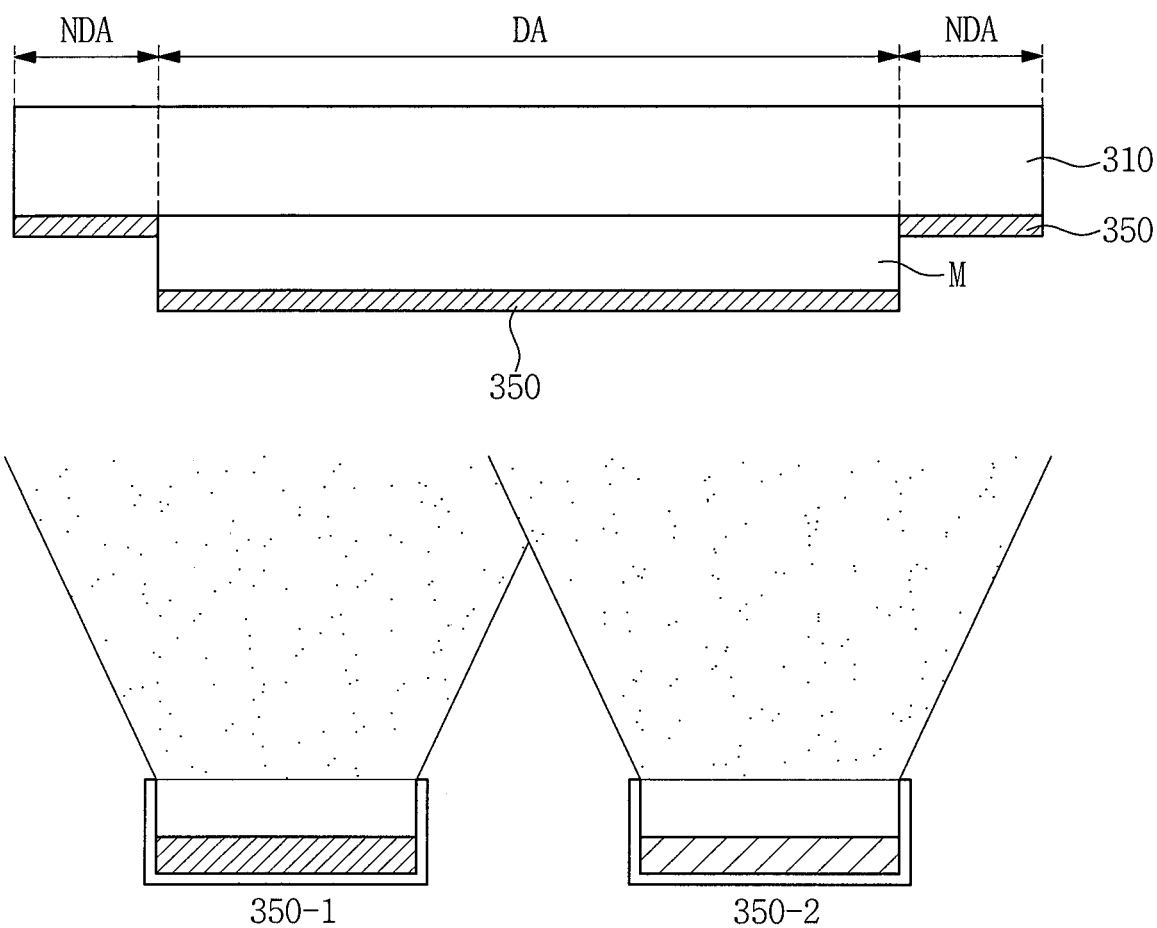
FIGS. 8A, 8B, 8C, 8D, and 8E are cross-sectional views illustrating an example embodiment of manufacturing processes of a display device.
Figure 8B:
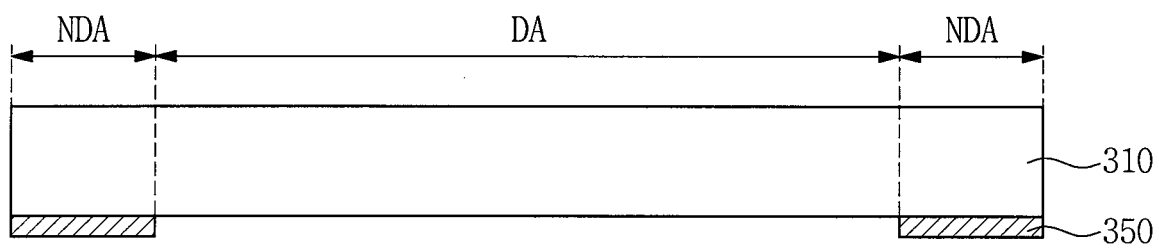

Referring to FIGS. 8A and 8B, the window substrate 310 including the display area DA and the non-display area NDA is provided. A mask M is arranged in the display area DA of the window substrate 310, and the organic-inorganic composite protective layer 350 is arranged on the mask M by co-depositing of an organic material 350-1 and an inorganic material 350-2. The mask M arranged in the display area D is removed, and the window substrate 310 on which the protective layer 350 is arranged in the non-display area NDA of the window substrate 310 is provided.

Figure 8C:
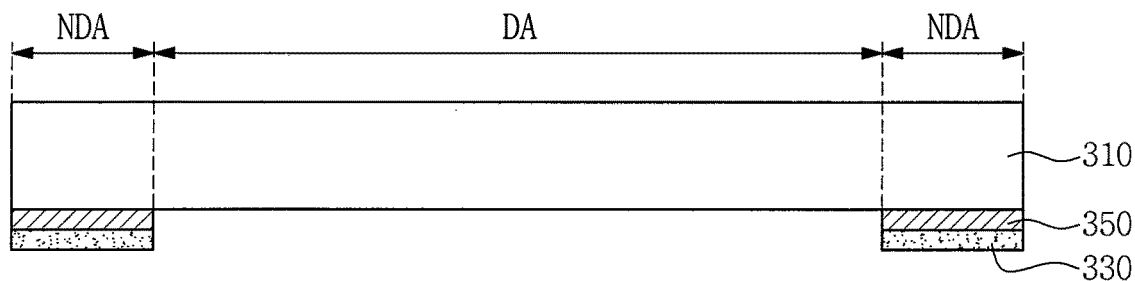

Referring to FIG. 8C, the light blocking layer 330 is arranged or formed on the protective layer 350 arranged in the non-display area NDA of the window substrate 310.

Through the manufacturing processes illustrated in FIGS. 8A, 8B, and 8C, the window panel 300 may be manufactured.

Figure 8D:
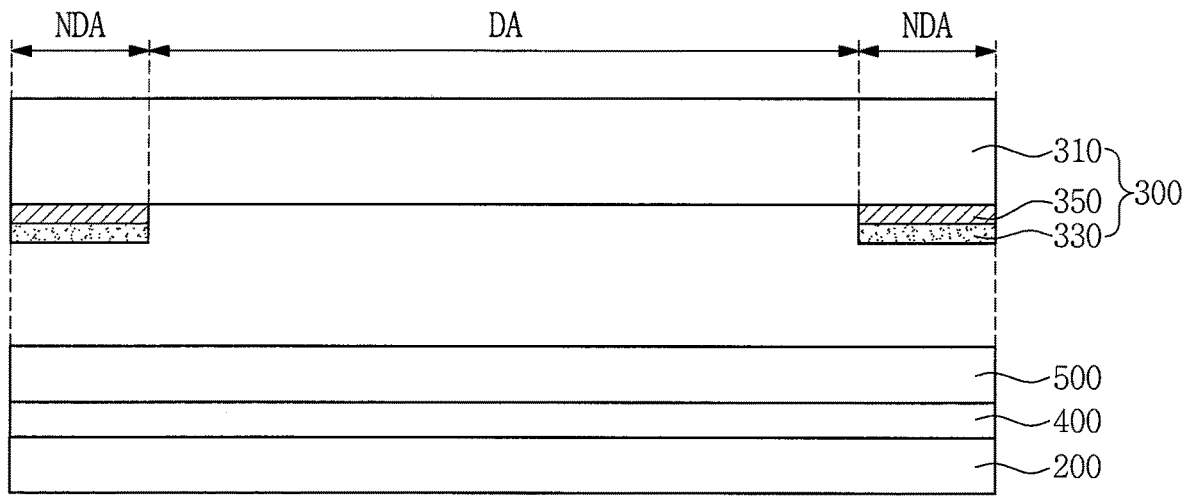

Referring to FIG. 8D, the display panel 200 with the polarizer 400 thereon is disposed below the window panel 300. The adhesive layer 500 is coated on the top of the display panel 200, for example, on the polarizer 400. The adhesive layer 500 may be a UV-curable resin.

Figure 8E:
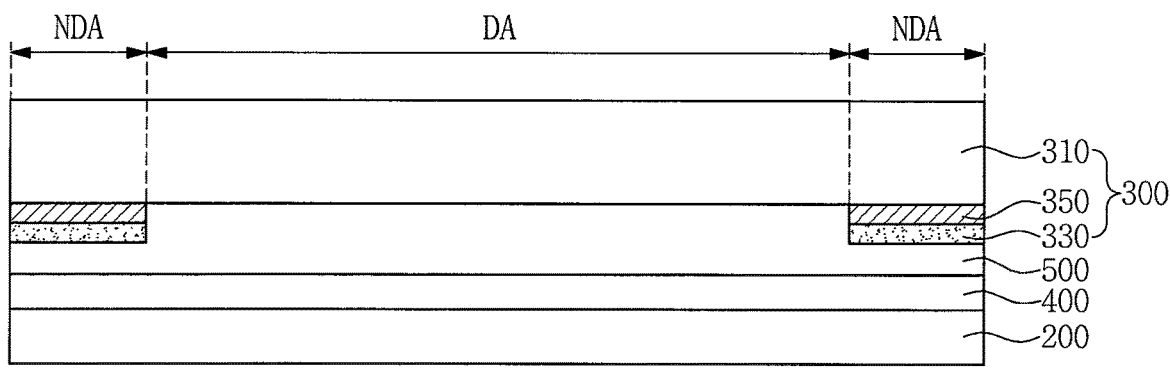

Referring to FIG. 8E, the display panel 200 and the window panel 300 may be bonded to one another by the adhesive layer 500. Although not illustrated, the adhesive layer 500 may be photo-cured by UV light.

Hereinafter, an alternative example embodiment of a display device will be described with reference to FIG. 9.

Figure 9:
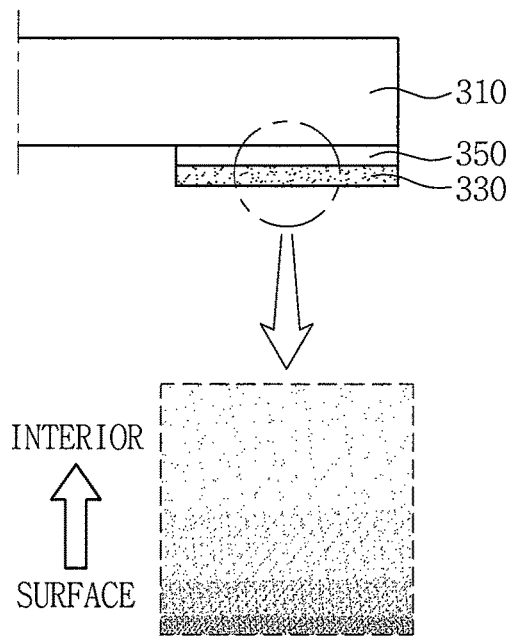
FIG. 9 is a cross-sectional view illustrating an alternative example embodiment of a window panel.

FIG. 9 is a cross-sectional view illustrating an alternative example embodiment of a window panel.

The display device according to an alternative example embodiment has the same configuration as that of the display device illustrated in FIG. 2, except that a light blocking layer arranged in a window panel undergoes an ion beam treatment. Accordingly, only a configuration of the window panel according to an alternative example embodiment that is different from that of the window panel 300 illustrated in FIG. 2 will be described herein, and the same or like elements shown in FIG. 9 have been labeled with the same reference numerals as previously used to describe an example embodiment of the display device illustrated in FIG. 2.

Referring to FIG. 9, a surface hardness of a light blocking layer 330 of the display device according to an alternative example embodiment decreases from a surface thereof to an interior thereof.

A state of the surface of the light blocking layer 330 that has undergone an ion beam treatment changes to a state that is difficult for a monomer of an uncured resin to permeate into. On the other hand, the interior of the light blocking layer 330, which is spaced apart from the surface of the light blocking layer 330 at a distance (e.g., a predetermined distance), may not be affected by the ion beam treatment.

In an example embodiment, the ion beam treatment may be performed under the following conditions without being limited thereto: ion beam energy in a range of 1 kiloelectron volt (KeV) (or about 1 KeV) to 10 megaelectron volts (MeV) (or about 10 MeV); ion power in a range of 0.01 watts per square centimeter (W/cm$^2$) (or about 1 W/cm$^2$) to 10 W/cm$^2$ (or about 10 W/cm$^2$); ion concentration in a range of $10^{10}$ ions/cm$^2$ (or about $10^{10}$ ions/cm$^2$) to $10^{20}$ ions/cm$^2$ (or about $10^{20}$ ions/cm$^2$); and a period of time for the ion beam treatment in a range of 1 second (or about 1 second) to 100 minutes (or about 100 minutes). While an ion beam treatment apparatus is in operation, a vacuum degree within a chamber of the ion beam treatment apparatus may be, for example, in a range of $1*10^{-6}$ Torr (or about $1*10^{-6}$ Torr) to 100 Torr (or about 100 Torr). During the ion beam treatment, a temperature of the window substrate 310 may be, for example, in a range of room temperature (or about room temperature) to 100. Celsius degrees (° C.) (or about 100° C.

A gas ion or a metal ion may be used for the ion beam treatment. The gas ion may be at least one selected from the group consisting of hydrogen (H), helium (He), carbon (C), oxygen (O), neon (Ne), xenon (Xe), and argon (Ar). The metal ion may be selected from lithium (Li), silicon (Si), titanium (Ti), chromium (Cr), platinum (Pt), and cobalt (Co).

In an example embodiment, the ion beam treatment may be performed using one ion at a time, for example, initially using one selected from the above examples and subsequently using another selected therefrom. In an alternative example embodiment, the ion beam treatment may be performed using two or more types of ions concurrently (e.g., simultaneously).

In an example embodiment, a protective film may be formed or arranged on the window substrate 310 to prevent the window substrate 310 from being scratched or contaminated with foreign materials during a transporting process, thereby reducing or effectively preventing damage that may be caused to the window substrate 310 during ion beam irradiation to the window substrate 310.

The ion beam treatment may affect a property, a structure, a composition, and the like, of the surface of the light blocking layer 330. When an ion is implanted to the light blocking layer 330, a surface-modifying effect may be exhibited in the light blocking layer 330. For example, when a polymer chain of the light blocking layer 330 is damaged (e.g., dissociated) by the ion beam treatment, the surface of the light blocking layer 330 may be modified.

Figure 10A:
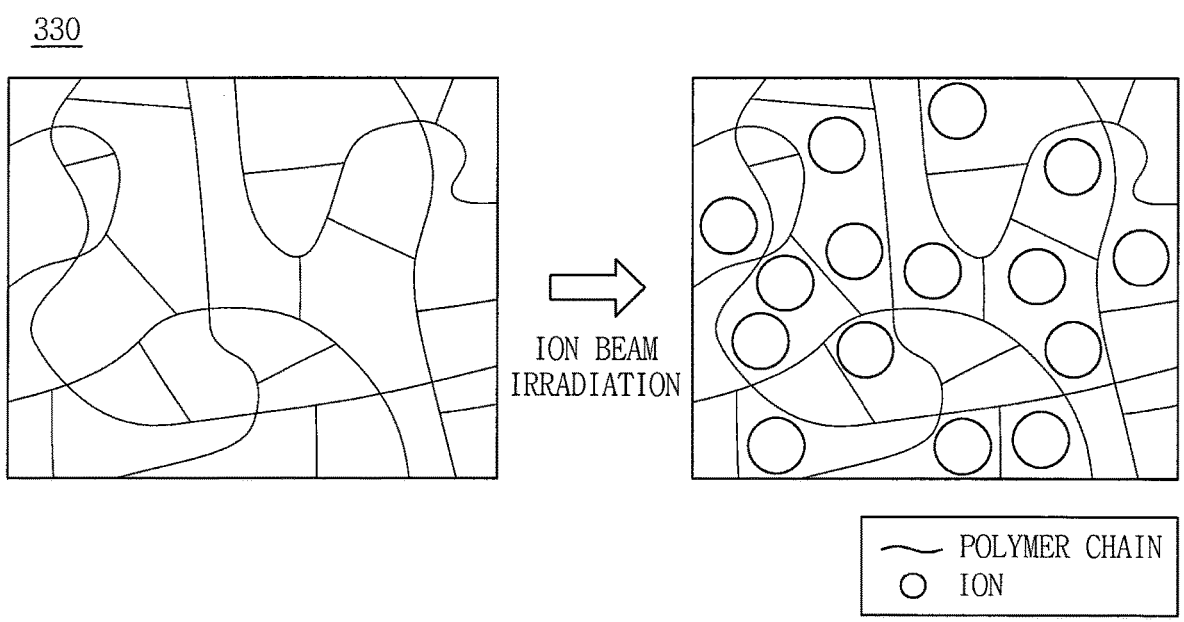
FIGS. 10A and 10B are mimetic views illustrating a variation in a light blocking layer during an ion beam treatment.

Referring to FIG. 10A, when an ion is implanted to the polymer chain of the light blocking layer 330, it may be difficult for a monomer of an uncured resin to permeate into the light blocking layer 330. The energy of ion beam acts on the light blocking layer 330 such that the number of ions being implanted is relatively large at the surface of the light blocking layer 330 and decreases toward the interior thereof.

Figure 10B:
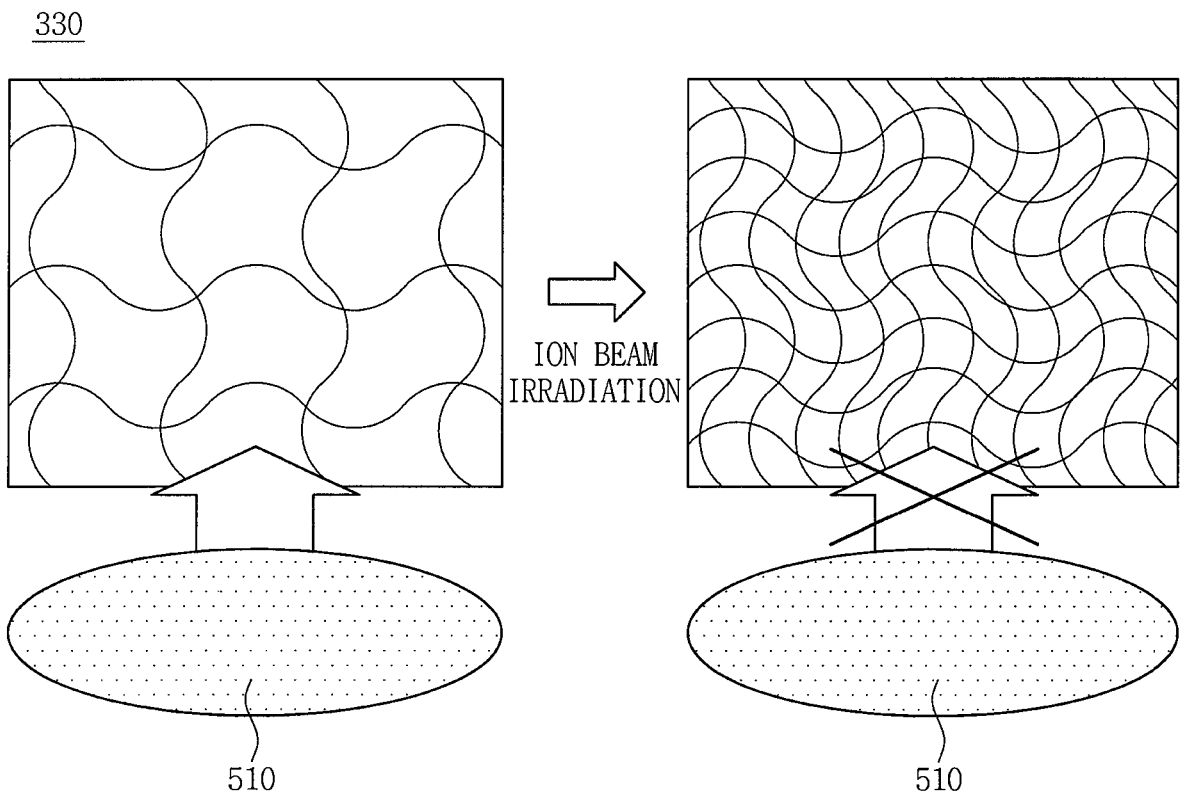

Referring to FIG. 10B, the light blocking layer 330 has a higher cross-linking density at the surface thereof than that in the interior thereof. For example, polymer degradation by chain scission initially occurs on the surface of the light blocking layer 330 by the ion beam treatment, polymer cross-linking subsequently occurs between the dissociated polymer chains, and then multiple bonding (e.g., double and/or triple bonding) occurs. Accordingly, the light blocking layer 330 has a higher cross-linking density at the surface thereof than that in the interior thereof.

When a material in one of solid, liquid, and gas phases (e.g., a solid phase) contacts a material in one of the other two phases (e.g., a gas or liquid phase), interfacial tension that assumes, without the action of external force, the smallest possible area of the interface between the two materials acts at the interface.

Referring to FIG. 10B, in a case of a relatively high cross-linking density as illustrated at the right side of FIG. 10B, an uncured resin 510 may have a relatively wide contact area with the light blocking layer 330 per unit area, as compared to a case of a relatively low cross-linking density as illustrated at the left side of FIG. 10B, such that wettability between the light blocking layer 330 and the uncured resin 510 decreases. In such an example embodiment, when a cross-linking density of the light blocking layer 330 is relatively high, due to a relatively dense structure of the polymer chain of the light blocking layer 330, a monomer in the uncured resin 510 may experience difficulty in permeating into the light blocking layer 330.

Accordingly, the display device according to an alternative example embodiment may reduce or effectively prevent discoloration of the light blocking layer 330 by suppressing the permeation of the uncured resin into the light blocking layer 330 as the surface hardness and the cross-linking density of the light blocking layer 330 are increased by the ion beam treatment.

Hereinafter, another alternative example embodiment of a display device will be described with reference to FIG. 11.

Figure 11:
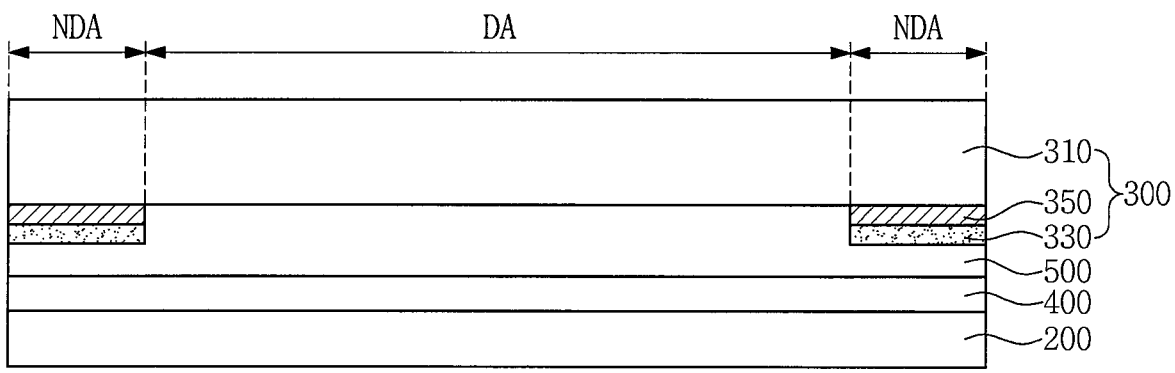
FIG. 11 is a cross-sectional view illustrating another alternative example embodiment of a display device.

FIG. 11 is a cross-sectional view illustrating another alternative example embodiment of the display device.

The display device according to another alternative example embodiment has the same configuration (or substantially the same configuration) as that of the display device illustrated in FIG. 2, except for a composition of an adhesive layer. Accordingly, the same or like elements shown in FIG. 11 have been labeled with the same reference numerals as previously used to describe an example embodiment of the display device illustrated in FIGS. 1 and 2, and a repetitive description thereof will be omitted herein for conciseness.

Referring to FIG. 11, an adhesive layer 500 according to another alternative example embodiment may include a UV/moisture dual-cured adhesive composition having a dual curing mechanism, e.g., a UV-cured area and a moisture-cured area in one resin.

In a conventional display device in which a UV-curable resin, for example, an acrylate-based resin, is used as an adhesive layer, an uncured portion of the resin which is not sufficiently exposed to UV light permeates into a light blocking layer.

In the display device according to another alternative example embodiment in which a UV/moisture dual-curable silicon-based (Si-based) resin is used as the adhesive layer 500, the resin is UV-cured at a portion thereof that is exposed to UV light and the resin is cured by moisture in air at a portion thereof that is not sufficiently exposed to UV light. Accordingly, it may be difficult for the uncured portion of the resin to permeate into the light blocking layer 330.

Hereinafter, still another alternative example embodiment of an adhesive layer 500 of a display device will be described with reference to Chemical Formulas 1, 2, 3, and 4.

Chemical Formula 1 represents a polymer compound structure of a Si-based resin used as the adhesive layer 500 according to still another alternative exemplary embodiment. Chemical Formula 2 represents an example of a Si-based polymer compound including a methoxy functional group. Chemical Formulas 3 and 4 represent a UV curing reaction and a moisture curing reaction of the Si-based polymer compound, respectively.

According to still another alternative example embodiment, the Si-based resin used as the adhesive layer 500 may include the Si-based polymer compound represented by Chemical Formula 1, which is UV/moisture dual-curable, i.e., UV-curing and moisture-curing being separately performed in different portions thereof. In addition, the Si-based resin may further include a UV initiator in an amount of about 0.01 wt % to about 10 wt %

[Chemical Formula 1]

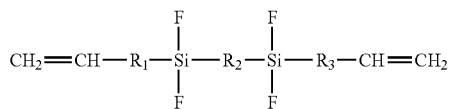

In Chemical Formula 1, a functional group F may be selected from an alkoxy group including methoxy ($CH_3O$—), ethoxy ($CH_2CH_2O$—), and propoxy ($CH_3CH_2CH_2O$—). Functional groups $R_1$, $R_2$ and $R_3$ are selected from an alkane group including —$CH_2$, —$CH_2CH_2$, and —$CH_2CH_2CH_2$.

Chemical Formula 2 represents the example of the Si-based polymer compound in which the functional group F is methoxy ($CH_3O$—). As represented in Chemical Formula 2, the Si-based resin according to still another alternative example embodiment includes a UV-curable area (hereinafter, "area L") and a moisture-curable area (hereinafter, "area W").

[Chemical Formula 2]

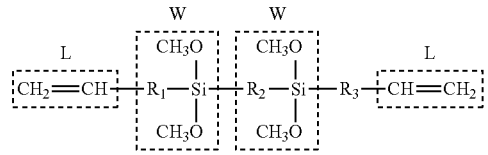

In bonding the display panel and the window panel to one another by coating, therebetween, the Si-based resin represented by Chemical Formula 2, the Si-based resin may be photo-cured by irradiating UV light through the window substrate. In an example embodiment, as represented in Chemical Formulas 2 and 3, UV curing may occur in area "L" of the Si-based resin which is exposed to UV light. In such an example embodiment, an amount of UV irradiation may be 10,000 mJ/cm² at maximum.

[Chemical Formula 3]

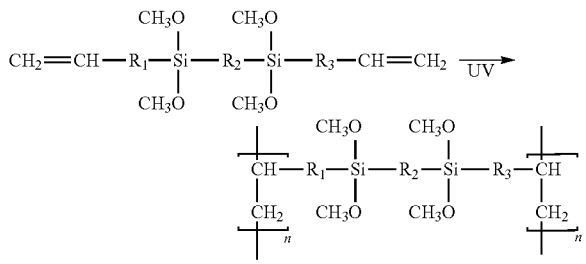

Subsequent to performing the UV curing, an uncured portion of the resin may exist at a portion of the resin that is not sufficiently exposed to the UV light. As such, the uncured portion of the resin during the UV irradiation may undergo moisture curing in area "W" by moisture in air as represented in Chemical Formulas 2 and 4.

In an example embodiment, a relative humidity during the moisture curing may be, for example, in a range of 1% (or about 1%) to 100% (or about 100%). In an example embodiment, a temperature during the moisture curing may be, for example, in a range of 0° C. (or about 0° C.) to 150° C. (or about 150° C.). Although natural curing may be performed at room temperature, a curing period of time may be shortened as a curing speed increases with an increase in the relative humidity and the temperature.

[Chemical Formula 4]

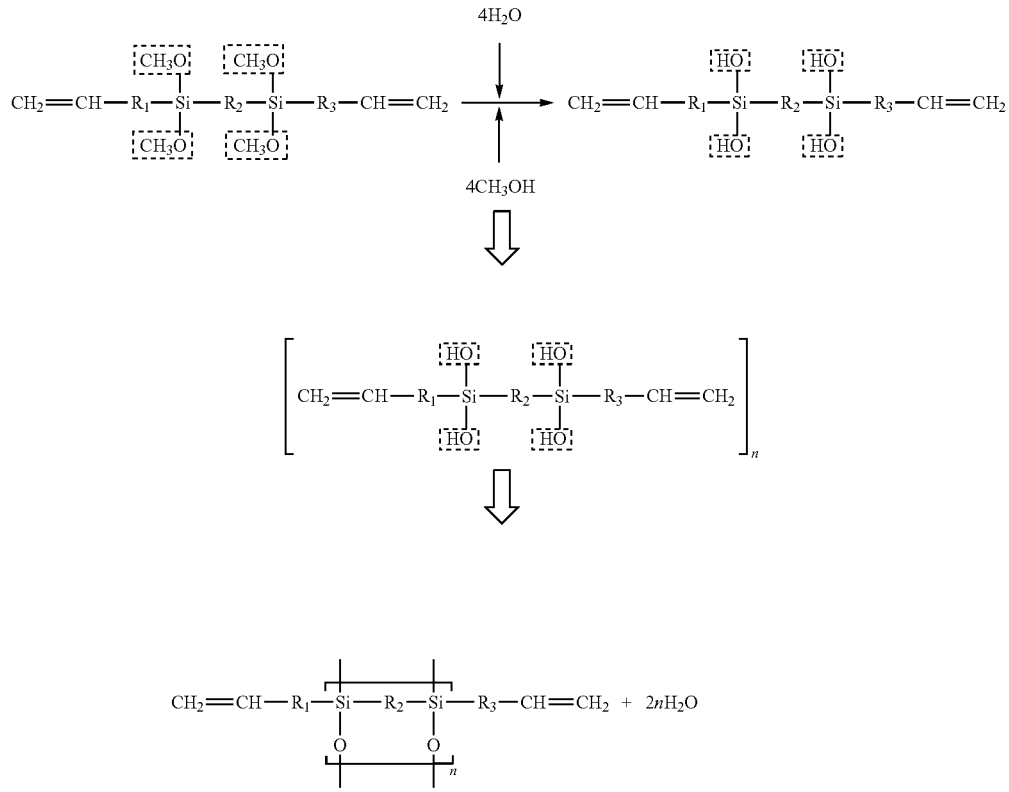

As such, the display device according to still another alternative example embodiment may use the UV/moisture dual-curable Si-based resin as the adhesive layer so as to address the non-curing issue of the resin, thereby reducing or effectively preventing discoloration of the light blocking layer caused by permeation of the uncured resin thereinto.

As set forth above, according to one or more example embodiments, the protective layer may reduce or effectively prevent damage to the light blocking layer by UV light, thus reducing or effectively preventing discoloration of the light blocking layer due to an uncured resin.

The ion beam treatment may be performed on the light blocking layer to enhance the surface hardness of the light blocking layer, thus reducing or effectively preventing discoloration of the light blocking layer due to an uncured resin.

The curing of the resin may be facilitated through the use of the UV/moisture-dual curable resin, thus reducing or effectively preventing discoloration of the light blocking layer due to an uncured resin.

From the foregoing, it will be appreciated that various example embodiments in accordance with the disclosure have been described herein for purposes of illustration, and that various modifications may be made without departing from the scope and spirit of the teachings. Accordingly, the various example embodiments disclosed herein are not intended to be limiting of the true scope and spirit of the teachings. Various features of the above described and other example embodiments can be mixed and matched in any manner, to produce further example embodiments consistent with the invention, as defined by the following claims, and their equivalents.

What is claimed is:
1. A display device comprising:
a display panel configured to display an image;
a window panel covering the display panel, and comprising a display area configured to transmit the image and a non-display area surrounding the display area; and
an adhesive layer between the display panel and the window panel,
wherein the window panel comprises:
a window substrate facing the display panel;
an ultraviolet light-blocking protective layer on a portion of a surface of the window substrate in the non-display area;
a light blocking layer directly disposed on the ultraviolet light-blocking protective layer, and
the ultraviolet light-blocking protective layer is an organic-inorganic composite layer,
wherein the ultraviolet light-blocking protective layer is between the window substrate and the light blocking layer in the non-display area and is not located in the display area, and is configured to block ultraviolet light from passing through the window substrate to the light blocking layer; and
a transparent film between and directly contacting the window substrate and the ultraviolet light-blocking protective layer at the non-display area and extending across the display area,
wherein an organic material of the organic-inorganic composite layer comprises at least one selected from the group consisting of benzotriazole, hydroxyphenyltriazine, cyanoacrylate, benzophenone, and hindered amine light stabilizers, and
wherein an inorganic material of the organic-inorganic composite layer comprises at least one selected from the group consisting of silicon dioxide ($SiO_2$), titanium dioxide ($TiO_2$), aluminum oxide ($Al_2O_3$), zinc oxide (ZnO), magnesium oxide (MgO), nickel oxide (NiO), indium oxide ($In_2O_3$), tin dioxide ($SnO_2$), indium-tin oxide ("ITO"), and aluminum-zinc oxide ("AZO").

2. The display device of claim 1, wherein the ultraviolet light-blocking protective layer comprises the organic material in a range of 0.1 percent by weight (wt %) to 50 wt %, and the inorganic material in a range of 50 wt % to 99.9 wt %.

3. The display device of claim 1, wherein the ultraviolet light-blocking protective layer has a thickness in a range of 1 nanometer (nm) to 1 millimeter (mm).

4. The display device of claim 1, wherein the ultraviolet light-blocking protective layer has a pattern.

5. The display device of claim 1, wherein the light blocking layer and the adhesive layer contact one another.

6. The display device of claim 1, wherein the light blocking layer comprises at least one ion selected from the group consisting of a gas ion and a metal ion.

7. The display device of claim 6, wherein the gas ion comprises at least one selected from the group consisting of hydrogen (H), helium (He), carbon (C), nitrogen (N), oxygen (O), neon (Ne), xenon (Xe), and argon (Ar).

8. The display device of claim 6, wherein the metal ion comprises at least one selected from the group consisting of lithium (Li), silicon (Si), titanium (Ti), chromium (Cr), platinum (Pt), and cobalt (Co).

9. The display device of claim 6, wherein a hardness of the light blocking layer decreases from a surface thereof to an interior thereof.

10. The display device of claim 1, wherein the adhesive layer comprises a silicon-based (Si-based) polymer represented by Chemical Formula 1:

[Chemical Formula 1]

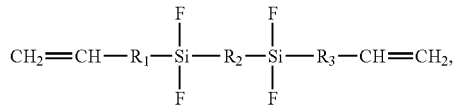

wherein F is selected from an alkoxy group comprising methoxy ($CH_3O$—), ethoxy ($CH_2CH_2O$—), and propoxy ($CH_3CH_2CH_2O$—), and $R_1$, $R_2$, and $R_3$ are selected from an alkane group comprising —$CH_2$, —$CH_2CH_2$, and —$CH_2CH_2CH_2$.

11. The display device of claim 10, wherein the adhesive layer further comprises an ultraviolet ("UV") initiator in a range of 0.01 wt % to 10 wt %.

12. The display device of claim 10, wherein the adhesive layer is cured by UV light of 10,000 millijoules per square centimeter ($mJ/cm^2$) or less.

13. The display device of claim 10, wherein the adhesive layer is cured at a relative humidity in a range of 1 percent (%) to 100%.

14. The display device of claim 1, wherein the display panel comprises:
a first substrate;
a second substrate on the first substrate; and
a polarizer on the second substrate, the polarizer facing the window panel.

15. The display device of claim 14, wherein the adhesive layer is between the polarizer and the window panel.

16. The display device of claim 14, wherein the display panel is an organic light emitting diode display panel.

17. The display device of claim 14, wherein the display panel is a liquid crystal display panel.

* * * * *